US012655242B2

(12) United States Patent
Imada et al.

(10) Patent No.: US 12,655,242 B2
(45) Date of Patent: Jun. 16, 2026

(54) PHENOLIC HYDROXY GROUP-CONTAINING RESIN, RESIN COMPOSITION FOR ALKALINE DEVELOPABLE RESIST, RESIST CURABLE RESIN COMPOSITION, AND METHOD FOR PRODUCING PHENOLIC HYDROXY GROUP-CONTAINING RESIN

(71) Applicant: DIC Corporation, Tokyo (JP)

(72) Inventors: Tomoyuki Imada, Ichihara (JP); Norio Nagae, Ichihara (JP)

(73) Assignee: DIC Corporation, Tokyo (JP)

( * ) Notice: Subject to any disclaimer, the term of this patent is extended or adjusted under 35 U.S.C. 154(b) by 732 days.

(21) Appl. No.: 18/026,909

(22) PCT Filed: Sep. 9, 2021

(86) PCT No.: PCT/JP2021/033079
§ 371 (c)(1),
(2) Date: Jul. 18, 2023

(87) PCT Pub. No.: WO2022/065041
PCT Pub. Date: Mar. 31, 2022

(65) Prior Publication Data

US 2024/0270891 A1 Aug. 15, 2024

(30) Foreign Application Priority Data

Sep. 28, 2020 (JP) ................................. 2020-162575

(51) Int. Cl.

| | |
|---|---|
| ***C08G 8/20*** | (2006.01) |
| ***G03F 7/11*** | (2006.01) |
| ***G03F 7/32*** | (2006.01) |

(52) U.S. Cl.
CPC .................. *C08G 8/20* (2013.01); *G03F 7/11* (2013.01); *G03F 7/322* (2013.01)

(58) Field of Classification Search
None
See application file for complete search history.

(56) References Cited

U.S. PATENT DOCUMENTS

2003/0153650 A1* 8/2003 Tada .................... H10W 74/47 523/400
2011/0259628 A1* 10/2011 Satou ................ C08G 59/3218 156/60

(Continued)

FOREIGN PATENT DOCUMENTS

JP 2010202750 A * 9/2010
JP 2010235643 A * 10/2010
JP 2010-285403 A 12/2010

OTHER PUBLICATIONS

Translated Description of Sato (Year: 2010).*

*Primary Examiner* — Mark F. Huff
*Assistant Examiner* — Andrew Preston Traywick
(74) *Attorney, Agent, or Firm* — Troutman Pepper Locke LLP

(57) ABSTRACT

Provided is a phenolic hydroxy group-containing resin having sufficient solubility in organic solvents, having excellent infiltratability into microscopic spaces because of having low viscosity and low polarity, and being capable of being (Continued)

used for ultrafine wiring pattern formation. Specifically, provided is a phenolic hydroxy group-containing resin containing one or more phenolic hydroxy group-containing compounds (1) selected from the group consisting of a compound (1) represented by Structural Formula (1) below and a compound (1') represented by Structural Formula (1') below.

(1)

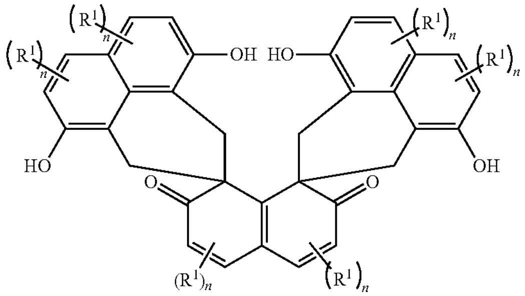

-continued (1')

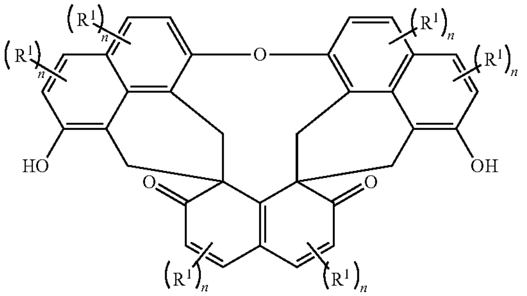

20 Claims, 3 Drawing Sheets

(56) References Cited

U.S. PATENT DOCUMENTS

2015/0037736 A1* 2/2015 Uchiyama ................. G03F 7/11 525/472

2017/0349690 A1* 12/2017 Imada .................. C09D 161/12

* cited by examiner

PHENOLIC HYDROXY GROUP-CONTAINING RESIN, RESIN COMPOSITION FOR ALKALINE DEVELOPABLE RESIST, RESIST CURABLE RESIN COMPOSITION, AND METHOD FOR PRODUCING PHENOLIC HYDROXY GROUP-CONTAINING RESIN

TECHNICAL FIELD

The present invention relates to a phenolic hydroxy group-containing resin, a resin composition for an alkaline developable resist, a resist curable resin composition, and a method for producing a phenolic hydroxy group-containing resin.

BACKGROUND ART

In recent years, as LSIs have become more highly integrated and faster, their pattern processing has been required to become finer and finer. In photolithography using ArF excimer laser light (193 nm), the intrinsic resolution limit derived from the wavelength of the light source has been surpassed by utilizing the optical properties of process materials and improving process equipment.

In the field of photoresists, various methods have been developed to form finer wiring patterns, one of which is the multilayer resist method. In the multilayer resist method, one or a plurality of layers called a resist underlayer film or an antireflection film are formed on a substrate, a resist pattern by ordinary photolithography is formed thereon, and then a wiring pattern is processed and transferred to the substrate by dry etching. One of the important components in the technology of the multilayer resist method is the resist underlayer film, and the underlayer film is required to have low viscosity, high dry etching resistance, and low light reflectivity. In addition, the resist underlayer film is formed in a solvent-diluted state, and thus a resin material for the resist underlayer film is required to be soluble in general-purpose organic solvents.

In addition, recent ultrafine wiring pattern formation often involves multiple repeated exposure and etching steps called double patterning and multi-patterning, and the underlayer film also plays an important role in filling in fine patterns produced in the previous process and then forming a smooth surface to be produced in the next step. Thus, the resist underlayer film material used for the underlayer material is required to have low viscosity and low polarity in order to infiltrate into microscopic spaces after material application and drying.

Anthracene skeleton-containing compounds are known as phenolic hydroxy group-containing compounds for conventional resist underlayer films (PTL 1 above).

CITATION LIST

Patent Literature

PTL 1: Japanese Unexamined Patent Application No. 2010-285403

SUMMARY OF INVENTION

Technical Problem

Although the anthracene skeleton-containing compounds described in PTL 1 above have low light reflectance of cured coating films and have excellent properties as antireflection films, their solubility in general-purpose organic solvents does not meet the current level of requirements, and their infiltratability into microscopic spaces is low due to their molecular size and n-n interaction by the wide aromatic electron cloud.

An object of the present invention is to provide a phenolic hydroxy group-containing resin having sufficient solubility in organic solvents, having excellent infiltratability into microscopic spaces because of having low viscosity and low polarity, and being capable of being used for ultrafine wiring pattern formation.

Another object of the present invention is to provide a resin composition for an alkaline developable resist having sufficient solubility in organic solvents, having excellent infiltratability into microscopic spaces because of having low viscosity and low polarity, and being capable of being used for ultrafine wiring pattern formation.

Another object of the present invention is to provide a resist curable resin composition having sufficient solubility in organic solvents, having excellent infiltratability into microscopic spaces because of having low viscosity and low polarity, and being capable of being used for ultrafine wiring pattern formation.

Another object of the present invention is to provide a method for producing a phenolic hydroxy group-containing resin having sufficient solubility in organic solvents, having excellent infiltratability into microscopic spaces because of having low viscosity and low polarity, and being capable of being used for ultrafine wiring pattern formation.

Solution to Problem

In order to achieve the above objects, the inventors of the present invention have earnestly studied to find out that a phenolic hydroxy group-containing resin containing a compound having a specific structure has sufficient solubility in organic solvents, has excellent infiltratability into microscopic spaces because of having low viscosity and low polarity, and is capable of being used for ultrafine wiring pattern formation and completed the present invention.

The present invention is a phenolic hydroxy group-containing resin containing one or more phenolic hydroxy group-containing compounds (1) selected from the group consisting of a compound (1) represented by Structural Formula (1) below and a compound (1') represented by Structural Formula (1') below:

[Chemical Formula 1]

(1)

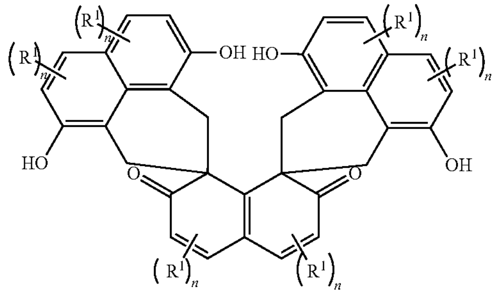

in the formula, $R^1$'s are each independently a hydrogen atom, an aliphatic hydrocarbon group, an alkoxy group, or a halogen atom; and n's are each independently an integer of 0 to 2;

[Chemical Formula 2]

(1')

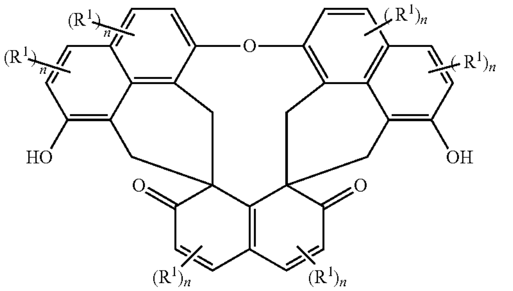

in the formula, $R^1$'s are each independently a hydrogen atom, an aliphatic hydrocarbon group, an alkoxy group, or a halogen atom; and n's are each independently an integer of 0 to 2.

The present invention is a resin composition for an alkaline developable resist containing:

the phenolic hydroxy group-containing resin;

a photosensitizer; and an organic solvent.

The present invention is a resist curable resin composition containing:

the phenolic hydroxy group-containing resin;

a curing agent; and an organic solvent.

The present invention is a method for producing a phenolic hydroxy group-containing resin including a step of reacting together 2,7-dihydroxynaphthalenes and formaldehyde in the presence of the formaldehyde in a range of 1.1 times or more to 10 times or less with respect to the 2,7-dihydroxynaphthalenes on a molar basis and an alkaline catalyst in a range of 1.1 times or more to 10 times or less with respect to the 2,7-dihydroxynaphthalenes on a molar basis.

Advantageous Effects of Invention

The present invention can provide a phenolic hydroxy group-containing resin having sufficient solubility in organic solvents, having excellent infiltratability into microscopic spaces because of having low viscosity and low polarity, and being capable of being used for ultrafine wiring pattern formation.

The present invention can provide a resin composition for an alkaline developable resist having sufficient solubility in organic solvents, having excellent infiltratability into microscopic spaces because of having low viscosity and low polarity, and being capable of being used for ultrafine wiring pattern formation.

The present invention can provide a resist curable resin composition having sufficient solubility in organic solvents, having excellent infiltratability into microscopic spaces because of having low viscosity and low polarity, and being capable of being used for ultrafine wiring pattern formation.

The present invention can provide a method for producing a phenolic hydroxy group-containing resin having sufficient solubility in organic solvents, having excellent infiltratability into microscopic spaces because of having low viscosity and low polarity, and being capable of being used for ultrafine wiring pattern formation.

DESCRIPTION OF EMBODIMENTS

Figure 1:
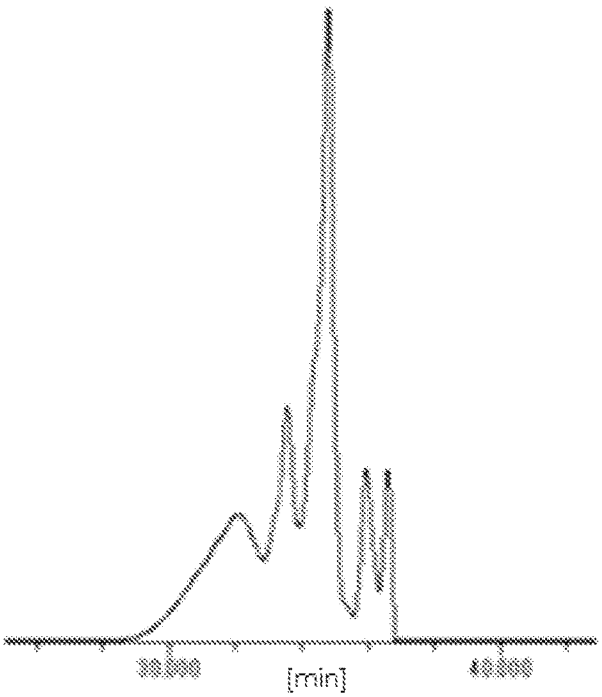
FIG. 1 is a GPC chart of a phenolic hydroxy group-containing resin obtained in Synthesis Example 1.

In an embodiment of the present invention, a phenolic hydroxy group-containing resin contains one or more phenolic hydroxy group-containing compounds (1) selected from the group consisting of a compound (1) represented by Structural Formula (1) below and a compound (1') represented by Structural Formula (1') below:

[Chemical Formula 3]

(1)

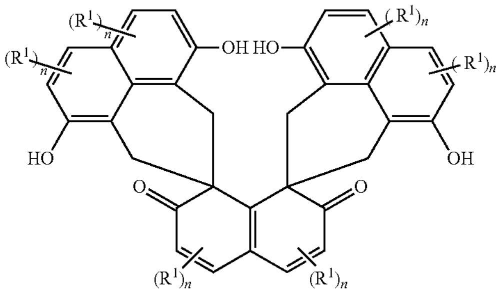

in the formula, $R^1$'s are each independently a hydrogen atom, an aliphatic hydrocarbon group, an alkoxy group, or a halogen atom; and n's are each independently an integer of 0 to 2;

[Chemical Formula 4]

(1')

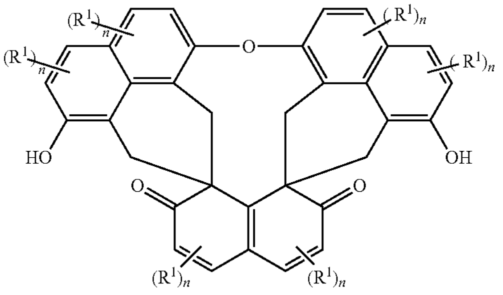

in the formula, $R^1$'s are each independently a hydrogen atom, an aliphatic hydrocarbon group, an alkoxy group, or a halogen atom; and n's are each independently an integer of 0 to 2.

The phenolic hydroxy group-containing resin has sufficient solubility in organic solvents, has excellent infiltratability into microscopic spaces because of having low viscosity and low polarity, and is capable of being used for ultrafine wiring pattern formation.

In Structural Formula (1) above and Structural Formula (1') above, $R^1$'s are each independently a hydrogen atom, an aliphatic hydrocarbon group, an alkoxy group, or a halogen atom. The letters n's are each independently an integer of 0 to 2. The aliphatic hydrocarbon group may be a linear one or a branched one and may have unsaturated bonds in the structure. Examples of the aliphatic hydrocarbon group include a methyl group, an ethyl group, a propyl group, an isopropyl group, a butyl group, a t-butyl group, and an isobutyl group. Examples of the alkoxy group include a methoxy group, an ethoxy group, a propyloxy group, and a butoxy group. Examples of the halogen atom include a fluorine atom, a chlorine atom, and a bromine atom. Among them, a hydrogen atom is preferred because it gives a phenolic hydroxy group-containing resin having more excellent infiltrability into microscopic spaces.

The content of the phenolic hydroxy group-containing compound (1) in the phenolic hydroxy group-containing resin, which is a value calculated from an area ratio in a GPC chart, is in a range of preferably 8% or more and more preferably 10% or more to preferably 30% or less and more preferably 25% or less from the viewpoints of solubility in organic solvents and infiltrability into minute spaces.

The phenolic hydroxy group-containing resin may contain other phenolic hydroxy group-containing compounds in addition to the phenolic hydroxy group-containing compound (1) to the extent that the effects of the present invention are not hindered.

Examples of the other phenolic hydroxy group-containing compounds that the phenolic hydroxy group-containing resin can contain include one or more phenolic hydroxy group-containing compounds (2) selected from the group consisting of a compound (2) represented by Structural Formula (2) below and a compound (2') represented by Structural Formula (2') below and one or more phenolic hydroxy group-containing compounds (3) selected from the group consisting of a compound (3) represented by Structural Formula (3) below and a compound (3') represented by Structural Formula (3') below:

[Chemical Formula 5]

(2)

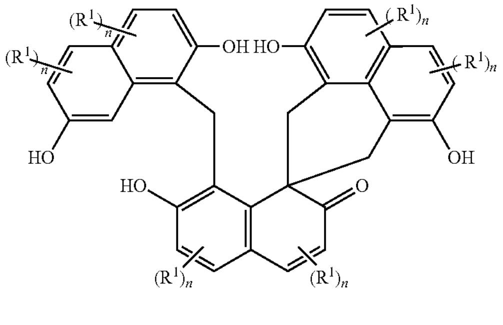

in the formula, $R^1$'s are each independently a hydrogen atom, an aliphatic hydrocarbon group, an alkoxy group, or a halogen atom; and n's are each independently an integer of 0 to 2;

[Chemical Formula 6]

(2')

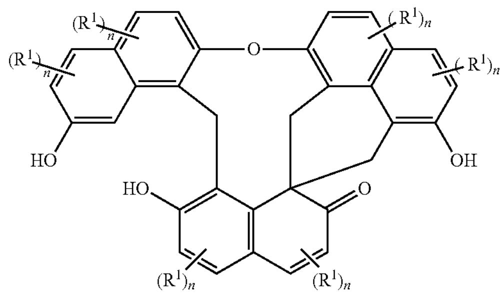

in the formula, $R^1$'s are each independently a hydrogen atom, an aliphatic hydrocarbon group, an alkoxy group, or a halogen atom; and n's are each independently an integer of 0 to 2;

[Chemical Formula 7]

(3)

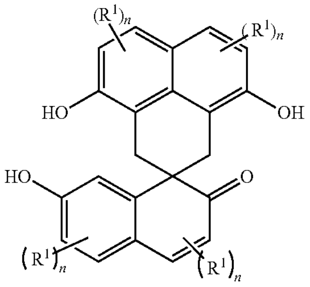

in the formula, $R^1$'s are each independently a hydrogen atom, an aliphatic hydrocarbon group, an alkoxy group, or a halogen atom; and n's are each independently an integer of 0 to 2;

[Chemical Formula 8]

(3')

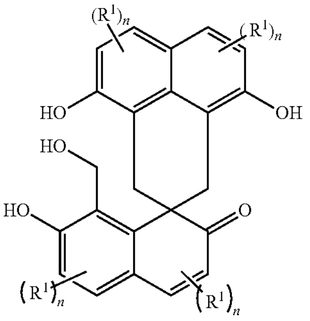

in the formula, $R^1$'s are each independently a hydrogen atom, an aliphatic hydrocarbon group, an alkoxy group, or a halogen atom; and n's are each independently an integer of 0 to 2.

Like the phenolic hydroxy group-containing compound (1), the phenolic hydroxy group-containing compound (2) and the phenolic hydroxy group-containing compound (3) have a structural moiety represented by Structural Formula (4) below and are thus characterized by excellent solubility in organic solvents and infiltrability into microscopic spaces:

[Chemical Formula 9]

(4)

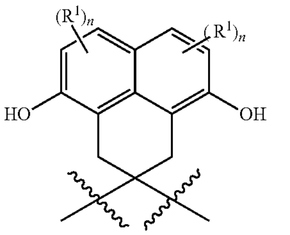

in the formula, $R^1$'s are each independently a hydrogen atom, an aliphatic hydrocarbon group, an alkoxy group, or a halogen atom; and n's are each independently an integer of 0 to 2.

area ratio in a GPC chart, is in a range of preferably 9% or more and more preferably 10% or more to preferably 45% or less and more preferably 35% or less from the viewpoints of solubility in organic solvents and infiltrability into microscopic spaces.

The content of the phenolic hydroxy group-containing compound (3) in the phenolic hydroxy group-containing resin, which is a value calculated from an area ratio in a GPC chart, is in a range of preferably 8% or more and more preferably 10% or more to preferably 25% or less and more preferably 20% or less from the viewpoints of solubility in organic solvents and infiltrability into microscopic spaces.

The phenolic hydroxy group-containing resin may further contain a phenolic hydroxy group-containing compound (4) having the structural moiety represented by Structural Formula (4) above and having a higher molecular weight than that of the phenolic hydroxy group-containing compound (1), as represented by Structural Formula (5) below:

[Chemical Formula 10]

(5)

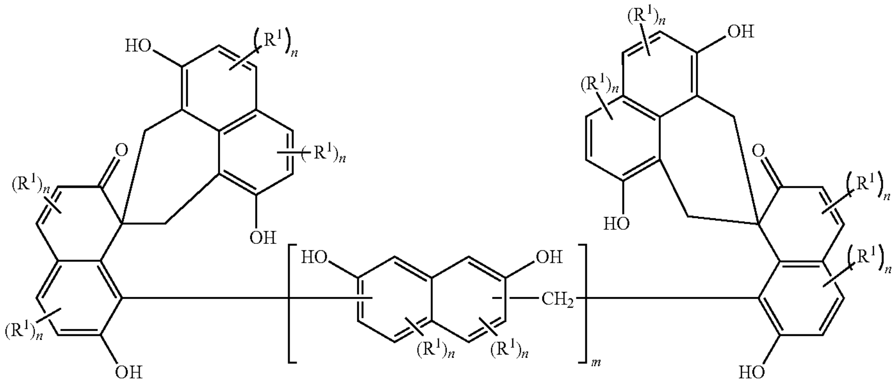

In Structural Formula (2) above, Structural Formula (2') above, Structural Formula (3) above, Structural Formula (3') above, and Structural Formula (4) above, $R^1$'s are each independently a hydrogen atom, an aliphatic hydrocarbon group, an alkoxy group, or a halogen atom. The letters n's are each independently an integer of 0 to 2. The aliphatic hydrocarbon group may be a linear one or a branched one and may have unsaturated bonds in the structure. Examples of the aliphatic hydrocarbon group include a methyl group, an ethyl group, a propyl group, an isopropyl group, a butyl group, a t-butyl group, and an isobutyl group. Examples of the alkoxy group include a methoxy group, an ethoxy group, a propyloxy group, and a butoxy group. Examples of the halogen atom include a fluorine atom, a chlorine atom, and a bromine atom. Among them, a hydrogen atom is preferred because it gives a phenolic hydroxy group-containing resin having more excellent infiltrability into microscopic spaces.

The content of the phenolic hydroxy group-containing compound (2) in the phenolic hydroxy group-containing resin, which is a value calculated from an area ratio in a GPC chart, is in a range of preferably 1% or more and more preferably 3% or more to preferably 15% or less and more preferably 10% or less from the viewpoints of solubility in organic solvents and infiltrability into microscopic spaces.

Furthermore, the total content of the phenolic hydroxy group-containing compound (1) and the phenolic hydroxy group-containing compound (2) in the phenolic hydroxy group-containing resin, which is a value calculated from an in the formula, $R^1$'s are each independently a hydrogen atom, an aliphatic hydrocarbon group, an alkoxy group, or a halogen atom; n's are each independently an integer of 0 to 2; and m is an integer of 1 or more.

The content of the phenolic hydroxy group-containing compound (4) in the phenolic hydroxy group-containing resin, which is a value calculated from an area ratio in a GPC chart, is in a range of preferably 15% or more and more preferably 20% or more to preferably 40% or less and more preferably 35% or less from the viewpoints of solubility in organic solvents and infiltrability into minute spaces.

The phenolic hydroxy group-containing resin may be produced in any way, and the method of production is not limited to a particular method. Examples thereof include one obtained by reacting together 2,7-dihydroxynaphthalenes and formaldehyde in the presence of the formaldehyde in a range of 1.1 times or more to 10 times or less with respect to the 2,7-dihydroxynaphthalenes on a molar basis and an alkaline catalyst in a range of 1.1 times or more to 10 times or less with respect to the 2,7-dihydroxynaphthalenes on a molar basis. The following describes, as a method for producing the phenolic hydroxy group-containing resin, a reaction step for reacting together 2,7-dihydroxynaphthalenes and formaldehyde in the presence of the formaldehyde in a range of 1.1 times or more to 10 times or less with respect to the 2,7-dihydroxynaphthalenes on a molar basis and an alkaline catalyst in a range of 1.1 times or more to 10 times or less with respect to the 2,7-dihydroxynaphthalenes on a molar basis.

Examples of the 2,7-dihydroxynaphthalenes include 2,7-dihydroxynaphthalene and other compounds having one or a plurality of substituents on the aromatic ring of 2,7-dihydroxynaphthalene. Examples of the substituents include hydrocarbon groups such as a methyl group, an ethyl group, a propyl group, an isopropyl group, a butyl group, a t-butyl group, and isobutyl group; alkoxy groups such as a methoxy group, an ethoxy group, a propyloxy group, and a butoxy group; and halogen atoms such as a fluorine atom, a chlorine atom, and a bromine atom. Specific examples of the 2,7-dihydroxynaphthalenes include 2,7-dihydroxynaphthalene, methyl-2,7-dihydroxynaphthalene, ethyl-2,7-dihydroxynaphthalene, t-butyl-2,7-dihydroxynaphthalene, methoxy-2,7-dihydroxynaphthalene, and ethoxy-2,7-dihydroxynaphthalene. Among them, 2,7-dihydroxynaphthalene is preferred because it gives a phenolic hydroxy group-containing resin having more excellent infiltrability into microscopic spaces.

The formaldehyde used in the reaction step may be a formalin solution in an aqueous solution state or paraformaldehyde in a solid state.

Examples of the alkaline catalyst used in the reaction step include alkali metal hydroxides such as sodium hydroxide and potassium hydroxide and inorganic alkalis such as metallic sodium, metallic lithium, sodium hydride, sodium carbonate, and potassium carbonate.

Specific examples of the method in the reaction step include a method in which the 2,7-dihydroxynaphthalenes and formaldehyde are prepared substantially simultaneously and are heated and stirred in the presence of an appropriate catalyst to carry out a reaction and a method in which formaldehyde is added to the system of a mixture solution of the 2,7-dihydroxynaphthalenes and an appropriate catalyst in a continuous or intermittent manner. Note that substantially simultaneously means that all the raw materials are prepared before the reaction is accelerated by heating.

In the reaction step, in view of forming the phenolic hydroxy group-containing compound (1) more efficiently, the 2,7-dihydroxynaphthalenes and formaldehyde are reacted in the presence of the formaldehyde in a range of 1.1 times or more and preferably 1.2 times or more to 10 times or less and preferably 8 times or less with respect to the 2,7-dihydroxynaphthalenes on a molar basis.

In the reaction step, in view of forming the phenolic hydroxy group-containing compound (1) more efficiently, the 2,7-dihydroxynaphthalenes and formaldehyde are reacted in the presence of the alkaline catalyst in a range of 1.1 times or more and preferably 1.2 times or more to 10 times or less and preferably 8 times or less with respect to the 2,7-dihydroxynaphthalenes on a molar basis.

In the reaction step, an organic solvent can be used as needed. Specific examples of the organic solvent that can be used include, but are not limited to, methyl cellosolve, isopropyl alcohol, ethyl cellosolve, toluene, xylene, and methyl isobutyl ketone. The amount of the organic solvent used is usually in a range of 0.1 times amount to 5 times amount and preferably in a range of 0.3 times amount to 2.5 times amount in particular with respect to the total mass of the prepared raw materials in view of efficiently obtaining the above compound (1). The reaction temperature is preferably in a range of 20 to 150° C. and more preferably in a range of 60 to 100° C. in particular. The reaction time, which is not limited to a particular time, is usually in a range of 1 to 10 hours.

After the reaction ends, neutralization or water washing treatment is performed until the pH value of the reaction mixture reaches 4 to 7. The neutralization treatment and the water washing treatment may be performed according to normal methods. For example, when the alkaline catalyst is used, an acidic substance such as acetic acid, phosphoric acid, or sodium phosphate can be used as a neutralizer. After performing the neutralization or water washing treatment, the organic solvent is distilled off under reduced pressure and heating, the product is concentrated, and a carbonyl group-containing phenolic compound can be obtained. It is more preferable to introduce a microfiltration step as part of post-reaction treatment operations in view of capability of purifying and removing inorganic salts and foreign substances.

When the phenolic hydroxy group-containing resin is produced by such a reaction step, in addition to the phenolic hydroxy group-containing compound (1), the phenolic hydroxy group-containing compound (2), the phenolic hydroxy group-containing compound (3), or the phenolic hydroxy group-containing compound (4), the phenolic hydroxy group-containing compound (5) represented by Structural Formula (6) below may be formed. In this case, the content of the phenolic hydroxy group-containing compound (5) in the phenolic hydroxy group-containing resin, which is a value calculated from an area ratio in a GPC chart, is in a range of preferably 40% or less and more preferably 35% or less from the viewpoints of solubility in organic solvents and infiltratability into microscopic spaces.

Furthermore, the total content of the phenolic hydroxy group-containing compound (3) and the phenolic hydroxy group-containing compound (5) in the phenolic hydroxy group-containing resin, which is a value calculated from an area ratio in a GPC chart, is in a range of preferably 8% or more and more preferably 10% or more to preferably 55% or less and more preferably 45% or less from the viewpoints of solubility in organic solvents and infiltrability into microscopic spaces.

[Chemical Formula 11]

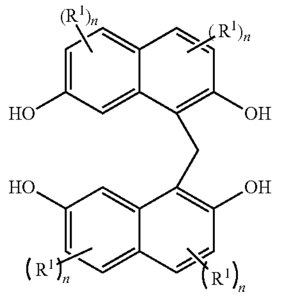

(6)

in the formula, $R^1$'s are each independently a hydrogen atom, an aliphatic hydrocarbon group, an alkoxy group, or a halogen atom; and n's are each independently an integer of 0 to 2.

In Structural Formula (6) above, $R^1$'s are each independently a hydrogen atom, an aliphatic hydrocarbon group, an alkoxy group, or a halogen atom. The letters n's are each independently an integer of 0 to 2. The aliphatic hydrocarbon group may be a linear one or a branched one and may have unsaturated bonds in the structure. Specific examples thereof include a methyl group, an ethyl group, a propyl group, an isopropyl group, a butyl group, a t-butyl group, and an isobutyl group. Examples of the alkoxy group include a methoxy group, an ethoxy group, a propyloxy group, and a butoxy group. Examples of the halogen atoms include a fluorine atom, a chlorine atom, and a bromine atom. Among them, a hydrogen atom is preferred because it gives a phenolic hydroxy group-containing resin having more excellent infiltrability into microscopic spaces.

The number average molecular weight (Mn) of the phenolic hydroxy group-containing resin is preferably in a range of 500 to 1,000. The weight average molecular weight (Mw) thereof is preferably in a range of 550 to 1,500. The polydispersity (Mw/Mn) thereof is preferably in a range of 1.1 to 3. In the present specification, the number average molecular weight (Mn) and the weight average molecular weight (Mw) of the phenolic hydroxy group-containing resin are ones measured under the measurement conditions described in the examples using gel permeation chromatography (hereinafter abbreviated as "GPC").

The phenolic hydroxy group-containing resin can be used as photoresist materials, underlayer films, interlayer insulating films, liquid crystal alignment films, black matrices, resist films for hole formation, and other materials.

The resin composition for an alkaline developable resist of the present embodiment contains the phenolic hydroxy group-containing resin, a photosensitizer, and an organic solvent. The resin composition for an alkaline developable resist can form ultrafine wiring patterns because of having low viscosity and low polarity.

Examples of the photosensitizer include compounds having a quinone diazide group. Specific examples of the compounds having a quinone diazide group include ester compounds and amidated products of aromatic (poly)hydroxy compounds and sulfonic acid compounds having a quinone diazide group. The ester compounds mean that they include partial ester compounds, whereas the amidated products mean that they include partial amidated products.

Specific examples of the sulfonic acid compounds having a quinone diazide group include naphthoquinone-1,2-diazide-5-sulfonic acid, naphthoquinone-1,2-diazide-4-sulfonic acid, ortho-anthraquinone diazide sulfonic acid, and 1,2-naphthoquinone-2-diazide-5-sulfonic acid. Specific examples of the sulfonic acid compounds having a quinone diazide include halides with further substitution for halogens.

Examples of the aromatic (poly)hydroxy compounds include polyhydroxybenzophenone compounds such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, and 2,3,3',4,4',5'-hexahydroxybenzophenone; bis[(poly)hydroxyphenyl] alkane compounds such as bis(2,4-dihydroxyphenyl) methane, bis(2,3,4-trihydroxyphenyl)methane, 2-(4-hydroxyphenyl)-2-(4'-(hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl] ethylidene}bisphenol, 4,4'-[1-[4-[1-(4-hydroxyphenyl)-1-methylethyl]phenyl]ethylidene]bisphenol, and 3,3'-dimethyl-{1-[4-[2-(3-methyl-4-hydroxyphenyl)-2-propyl] phenyl]ethylidene}bisphenol; tris(hydroxyphenyl)methane compounds such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane, and bis(4-hydroxy-3,5-dimethylphenyl)-3,4-dihydroxyphenylmethane and methyl substituted forms thereof; and bis(cyclohexylhydroxyphenyl)(hydroxyphenyl)methane compounds such as bis(3-cyclohexyl-4-hydroxyphenyl)-3-hydroxyphenylmethane, bis (3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2 methylphenyl)-3-hydroxyphenylmethane, bis(5-cyclohexyl-4-hydroxy-2-methylphenyl)-4-hydroxyphenylmethane, bis(3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane, and bis(5-cyclohexyl-2-hydroxy-4-methylphenyl)-4-hydroxyphenylmethane and methyl substituted forms thereof. These may be used alone or in combination of two or more.

The content of the photosensitizer in the resin composition for an alkaline developable resist is in a range of preferably 15% by mass or more and more preferably 20% by mass or more to preferably 40% by mass or less and more preferably 30% by mass or less with respect to the total mass of a resin solid content (the component after removing the organic solvent from the resin composition for an alkaline developable resist) because good sensitivity and desired patterns can be obtained.

Examples of the organic solvent in the resin composition for an alkaline developable photoresist include polar aprotic solvents such as N-methyl-2-pyrrolidone, γ-butyrolactone, N,N-dimethylformamide, N,N-dimethylacetamide, and dimethylsulfoxide; ethers such as tetrahydrofuran, dioxane, propylene glycol monomethyl ether, and propylene glycol monoethyl ether; ketones such as acetone, methyl ethyl ketone, and diisobutyl ketone; esters such as ethyl acetate, ethyl acetate, butyl acetate, isobutyl acetate, propyl acetate, propylene glycol monomethyl ether acetate, and 3-methyl-3-methoxybutyl acetate; alcohols such as ethyl lactate, methyl lactate, diacetone alcohol, and 3-methyl-3-methoxybutanol; and aromatic hydrocarbons such as toluene and xylene. These solvents can be used alone or in combination of two or more.

As to the content of the organic solvent in the resin composition for an alkaline developable resist, the solid content concentration in the resin composition for an alkaline developable resist is preferably 1% by mass or more and preferably 65% by mass or less because the fluidity of the resin composition for an alkaline developable resist is sufficiently increased and a uniform coating film can be obtained by an application method such as spin coating.

In addition to the phenolic hydroxy group-containing resin, the photosensitizer, and the organic solvent, the resin composition for an alkaline developable resist may contain other resins other than the phenolic hydroxy group-containing resin and various additives to the extent that the effects of the present invention are not hindered. Examples of the various additives include fillers, pigments, surfactants such as leveling agents, adhesion improvers, and dissolution accelerators.

Examples of the other resins include phenolic resins other than the phenolic hydroxy group-containing resin; homopolymers and copolymers of hydroxy group-containing styrene compounds such as p-hydroxy styrene and p-(1,1,1,3,3,3-hexafluoro-2-hydroxypropyl)styrene; resins obtained by modifying the hydroxy groups of the phenolic resins or the polymers of the hydroxy group-containing styrene compounds with acid degradable groups such as a t-butoxycarbonyl group and a benzyloxycarbonyl group; homopolymers and copolymers of (meth)acrylic acid; and alternating polymers of alicyclic polymerizable monomers such as norbornene compounds and tetracyclododecene compounds and maleic anhydride or maleimide.

Specific examples of the phenolic resins other than the phenolic hydroxy group-containing resin include phenolic resins such as phenol novolac resins, cresol novolac resins, naphthol novolac resins, co-condensed novolac resins using various phenolic compounds, aromatic hydrocarbon formaldehyde resin-modified phenolic resins, dicyclopentadiene-phenol addition type resins, phenol aralkyl resins (xylok resins), naphthol aralkyl resins, trimethylolmethane resins, tetraphenylolethane resins, biphenyl-modified phenolic resin (polyvalent phenolic compounds with phenolic nuclei linked by bismethylene groups), biphenyl-modified naphthol resins (polyvalent naphthol compounds with phenolic nuclei linked by bismethylene groups), aminotriazine-modified phenolic resins (polyvalent phenolic compounds with phenolic nuclei linked by melamine, benzoguanamine, or the like), and alkoxy group-containing aromatic ring-modified novolac resins (polyvalent phenolic compounds with a phenolic nucleus and an alkoxy group-containing aromatic ring linked by formaldehyde).

Among the specific examples of the phenolic resins other than the phenolic hydroxy group-containing resin, cresol novolac resins and co-condensed novolac resins of cresol and other phenolic compounds are preferred because they give a photosensitive composition with an excellent balance of developability, heat resistance, and flowability. Cresol novolac resins or co-condensed novolac resins of cresol and other phenolic compounds are specifically novolac resins obtained, with one or more cresols selected from o-cresol, m-cresol, and p-cresol and an aldehyde compound as essential reaction raw materials, by using other phenolic compounds in combination as appropriate.

The other resins may be used alone or in combination of two or more.

The content of the other resins in the resin composition for an alkaline developable resist is not limited to a particular content and may be set as desired depending on the desired use. The proportion of the phenolic hydroxy group-containing resin to the total of the resin component in the resin composition for an alkaline developable resist may be set to 60% by mass or more and preferably 80% by mass or more, for example.

The resin composition for an alkaline developable resist can be prepared by stirring and mixing together the phenolic hydroxy group-containing resin, the photosensitizer, the organic solvent, and even various additives added as needed by a normal method to make a uniform liquid.

When solid materials such as fillers and pigments are blended into the resin composition for an alkaline developable resist, it is preferable to disperse and mix them using a dispersing device such as a dissolver, a homogenizer, or a three-roll mill. To remove coarse particles and impurities, the composition can also be filtered using a mesh filter, a membrane filter, or the like.

The coating film made by curing the resin composition for an alkaline developable resist is exposed through a mask, which causes structural changes in the coating film in an exposed area and promotes solubility in an alkaline developing solution. On the other hand, a non-exposed area retains low solubility for the alkaline developing solution, and this difference in solubility enables patterning by alkaline development and can be used as a resist film.

Examples of a light source for exposing the coating film include infrared light, visible light, ultraviolet light, far-ultraviolet light, X-rays, and electron beams. Among these light sources, ultraviolet light is preferred, and g-line (wavelength: 436 nm) and i-line (wavelength: 365 nm) from high-pressure mercury lamps are suitable.

Examples of the alkaline developing solution for use in development after exposure include aqueous alkaline solutions of inorganic alkaline substances such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyl diethylamine; alcohol amines such as dimethylethanolamine and triethanolamine; quaternary ammonium salts such as tetramethylammonium hydroxide and tetraethylammonium hydroxide; and cyclic amines such as pyrrole and piperidine. Alcohols, surfactants, or the like can be added to these alkaline developing solutions as appropriate as needed. The alkali concentration of the alkaline developing solution is usually preferably in a range of 2 to 5% by mass, and a 2.38% by mass aqueous tetramethylammonium hydroxide solution is commonly used.

The resist curable resin composition of the present embodiment contains the phenolic hydroxy group-containing resin, a curing agent, and an organic solvent. The resist curable resin composition of the present embodiment can form ultrafine wiring patterns because of having low viscosity and low polarity.

The curing agent is not limited to a particular curing agent so long as it is a compound that can cause a curing reaction with the phenolic hydroxy group-containing resin. Examples thereof include melamine compounds, guanamine compounds, glycoluril compounds, urea compounds, resol resins, epoxy compounds, isocyanate compounds, azide compounds, compounds containing a double bond such as an alkenyl ether group, acid anhydrides, and oxazoline compounds.

Examples of the melamine compounds include hexamethylol melamine, hexamethoxymethyl melamine, compounds in which one to six methylol groups of hexamethylol melamine are methoxymethylated, hexamethoxyethyl melamine, hexaacyloxymethyl melamine, and compounds in which one to six methylol groups of hexamethylol melamine are acyloxymethylated.

Examples of the guanamine compounds include tetramethylolguanamine, tetramethoxymethylguanamine, tetramethoxymethylbenzoguanamine, compounds in which one to four methylol groups of tetramethylolguanamine are methoxymethylated, tetramethoxyethylguanamine, tetraacyloxyguanamine, and compounds in which one to four methylol groups of tetramethylolguanamine are acyloxymethylated.

Examples of the glycoluril compounds include 1,3,4,6-tetrakis(methoxymethyl)glycoluril, 1,3,4,6-tetrakis(butoxymethyl)glycoluril, and 1,3,4,6-tetrakis(hydroxymethyl)glycoluril.

Examples of the urea compounds include 1,3-bis(hydroxymethyl)urea, 1,1,3,3-tetrakis(butoxymethyl)urea, and 1,1,3,3-tetrakis(methoxymethyl)urea.

Examples of the resol resins include polymers obtained by reacting together phenolic hydroxy group-containing compounds such as phenol, alkylphenols such as cresol and xylenol, phenylphenol, resorcinol, biphenyl, bisphenols such as bisphenol A and bisphenol F, naphthol, and dihydroxynaphthalene and aldehyde compounds under alkaline catalytic conditions.

Examples of the epoxy compounds include diglycidyl oxynaphthalene, phenol novolac type epoxy resins, cresol novolac type epoxy resins, naphthol novolac type epoxy resins, naphthol-phenol co-condensed novolac type epoxy resins, naphthol-cresol co-condensed novolac type epoxy resins, phenol-aralkyl type epoxy resins, naphthol-aralkyl type epoxy resins, 1,1-bis(2,7-diglycidyloxy-1-naphthyl)alkane, naphthylene ether type epoxy resins, triphenylmethane type epoxy resins, dicyclopentadiene-phenol addition reaction type epoxy resins, phosphorus atom-containing epoxy resins, and polyglycidyl ethers of co-condensates of phenolic hydroxy group-containing compounds and alkoxy group-containing aromatic compounds.

Examples of the isocyanate compounds include tolylene diisocyanate, diphenylmethane diisocyanate, hexamethylene diisocyanate, and cyclohexane diisocyanate.

Examples of the azide compounds include 1,1'-biphenyl-4,4'-bisazide, 4,4'-methylidenebisazide, and 4,4'-oxybisazide.

Examples of the compounds containing a double bond such as an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, 1,4-cyclohexanedimethanol divinyl ether, pentaerythritol trivinyl ether, pentaerythritol tetravinyl ether, sorbitol tetravinyl ether, sorbitol pentavinyl ether, and trimethylol propane trivinyl ether.

Examples of the acid anhydrides include aromatic acid anhydrides such as phthalic anhydride, trimellitic anhydride, pyromellitic anhydride, 3,3',4,4'-benzophenone tetracarboxylic dianhydride, biphenyl tetracarboxylic dianhydride, 4,4'-(isopropylidene)diphthalic anhydride, and 4,4'-(hexafluoroisopropylidene) diphthalic anhydride; and alicyclic carboxylic anhydrides such as tetrahydrophthalic anhydride, methyl tetrahydrophthalic anhydride, hexahydrophthalic anhydride, methyl hexahydrophthalic anhydride, endomethylene tetrahydrophthalic anhydride, dodecenyl succinic anhydride, and trialkyltetrahydrophthalic anhydrides.

Among the curing agents, glycoluril compounds, urea compounds, and resol resins are preferred, and glycoluril compounds are more preferred because they give high curability and give a cured product with excellent heat resistance.

The curing agent may be used alone or in combination of two or more. The content of the curing agent in the resist curable resin composition is preferably 0.5 to 50 parts by mass with respect to a total of 100 parts by mass of the resin component of the resist curable resin composition.

Examples of the organic solvent include alkylene glycol monoalkyl ethers such as ethylene glycol monomethyl ether, ethylene glycol monoethyl ether, ethylene glycol monopropyl ether, ethylene glycol monobutyl ether, and propylene glycol monomethyl ether; dialkylene glycol dialkyl ethers such as diethylene glycol dimethyl ether, diethylene glycol diethyl ether, diethylene glycol dipropyl ether, and diethylene glycol dibutyl ether; alkylene glycol alkyl ether acetates such as ethylene glycol monomethyl ether acetate, ethylene glycol monoethyl ether acetate, and propylene glycol monomethyl ether acetate; ketone compounds such as acetone, methyl ethyl ketone, cyclohexanone, and methyl amyl ketone; cyclic ethers such as dioxane; and ester compounds such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, and ethyl acetoacetate.

The organic solvent may be used alone or in combination of two or more. The content of the organic solvent in the resist curable resin composition is not limited to a particular content and may be set to an amount that can dissolve all of the phenolic hydroxy group-containing resin and the curing agent in the resist curable resin composition, for example.

The resist curable resin composition may optionally contain other components to the extent that the effects of the present invention are not impaired. Examples of the other components include other phenolic resins other than the phenolic hydroxy group-containing resin, curing accelerators, surfactants, dyes, fillers, cross-linking agents, and dissolution accelerators.

Examples of the other phenolic resins include novolac resins, addition polymerization resins of alicyclic diene compounds such as dicyclopentadiene and phenolic compounds, modified novolac resins of phenolic hydroxy group-containing compounds and alkoxy group-containing aromatic compounds, phenol aralkyl resins (xylok resins), naphthol aralkyl resins, trimethylolmethane resins, tetraphenylol ethane resins, biphenyl-modified phenolic resins, biphenyl-modified naphthol resins, aminotriazine-modified phenolic resins, and vinyl polymers.

Specific examples of the novolac resins include polymers obtained by reacting together phenolic hydroxy group-containing compounds such as phenol, alkylphenols such as cresol and xylenol, phenylphenol, resorcinol, biphenyl, bisphenols such as bisphenol A and bisphenol F, naphthol, and dihydroxynaphthalene and aldehyde compounds under acidic catalytic conditions.

Specific examples of the vinyl polymers include homopolymers of vinyl compounds such as polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, and poly(meth)acrylate and copolymers of these compounds.

The other resins may be used alone or in combination of two or more.

The content of the other resins in the resist curable resin composition is not limited to a particular content and may be set as desired depending on the desired use. The other resins are preferably 0.5 to 100 parts by mass with respect to 100 parts by mass of the phenolic hydroxy group-containing resin contained in the resist curable resin composition, for example.

Specific examples of the curing accelerators include acetic acid, oxalic acid, sulfuric acid, hydrochloric acid, phenol sulfonic acid, p-toluenesulfonic acid, zinc acetate, manganese acetate, and photoacid generators.

The curing accelerators may be used alone or in combination of two or more.

The content of the curing accelerators in the resist curable resin composition is not limited to a particular content and is preferably 0.1 to 10 parts by mass with respect to 100 parts by mass of the resin solid content of the resist curable resin composition.

The resist curable resin composition can be produced by blending the above components and mixing them together using a stirrer or the like. When containing fillers or pigments, the resist curable resin composition can be produced by dispersing or mixing them together using a dispersing device such as a dissolver, a homogenizer, or a three-roll mill.

The resist curable resin composition can be used as a resist material, and a coating film formed by curing the resist curable resin composition can be used as a resist.

When using the resist curable resin composition as a resist material, the resist curable resin composition may be used as it is as a coating material, or the resist curable resin composition may be applied onto a support film, desolvated, and used as a resist film.

Examples of the support films include synthetic resin films of polyethylene, polypropylene, polycarbonate, polyethylene terephthalate, and the like. The support film may be a single layer film or a laminate film including a plurality of films. The surface of the support film may be corona treated or coated with a release agent.

The method for applying the resist curable resin composition may be any method such as spin coating, roll coating, flow coating, dip coating, spray coating, or doctor blade coating.

When using the resist curable resin composition for resist underlayer film use, examples of the method for producing a resist underlayer film include the following.

The resist underlayer film is formed by a method of applying the resist curable resin composition onto an object to be subjected to photolithography, such as a silicon substrate, a silicon carbide substrate, or a gallium nitride substrate, drying the resist curable resin composition at a temperature condition of 100 to 200° C., and further heating and curing the resist curable resin composition at a temperature condition of 250 to 400° C., for example. Next, normal photolithography operation is performed on this underlayer film to form a resist pattern, and dry etching treatment is performed with a halogen-based plasma gas or the like to form a resist pattern by the multilayer resist method.

The resist curable resin compositions can also be used for uses such as resist flat films and resist antireflection films.

EXAMPLES

The following specifically describes the present invention with reference to examples, but the present invention is not limited to these examples.

<GPC Measurement> Measuring apparatus: "HLC-8220 GPC" manufactured by Tosoh Corporation, Column: "Shodex KF802" (8.0 mmT×300 mm) manufactured by Showa Denko K.K.+"Shodex KF802" (8.0 mmT×300 mm) manufactured by Showa Denko K.K.+"Shodex KF803" (8.0 mmT×300 mm) manufactured by Showa Denko K.K.+ "Shodex KF804" (8.0 mmT×300 mm) manufactured by Showa Denko K.K. Column temperature: 40° C., Detector: RI (differential refractometer), Data processing: "GPC-8020 Model II Version 4.30" manufactured by Tosoh Corporation, Development solvent: Tetrahydrofuran, Flow rate: 1.0 mL/minute, Sample: A 0.5% by mass tetrahydrofuran solution in terms of a resin solid content, filtered through a micro filter. Injection volume: 0.1 mL, Standard sample: Monodisperse polystyrenes below: (Standard sample: monodisperse polystyrenes) "A-500" manufactured by Tosoh Corporation, "A-2500" manufactured by Tosoh Corporation, "A-5000" manufactured by Tosoh Corporation, "F-1" manufactured by Tosoh Corporation, "F-2" manufactured by Tosoh Corporation, "F-4" manufactured by Tosoh Corporation, "F-10" manufactured by Tosoh Corporation, and "F-20" manufactured by Tosoh Corporation <FD-MS Measurement>

FD-MS was measured using a double-focusing mass spectrometer AX505H (FD505H) manufactured by JEOL Ltd.

<$^{13}$C-NMR Spectral Measurement>

For $^{13}$C-NMR spectral measurement, "AL-400" manufactured by JEOL Ltd. was used, and Acetone-d6 solutions of samples were analyzed to perform structural analysis. The following lists conditions for $^{13}$C-NMR spectral measurement.

[Conditions for $^{13}$C-NMR Spectral Measurement]

Measurement mode: SGNNE (NOE-eliminated 1H complete decoupling method)
Pulse angle: 45° C. pulse
Sample concentration: 30% by mass
Integration count: 10,000 times

<Examples>[Synthesis Example 1: Synthesis of Phenolic Hydroxy Group-Containing Resin (A1]

Figure 2:
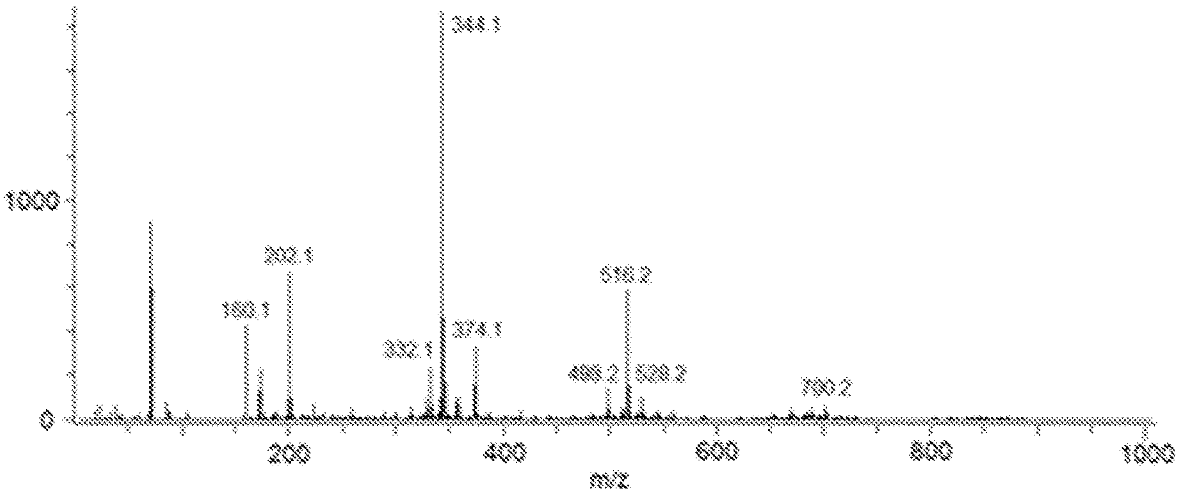
FIG. 2 is an FD-MS chart of the phenolic hydroxy group-containing resin obtained in Synthesis Example 1.
Figure 3:
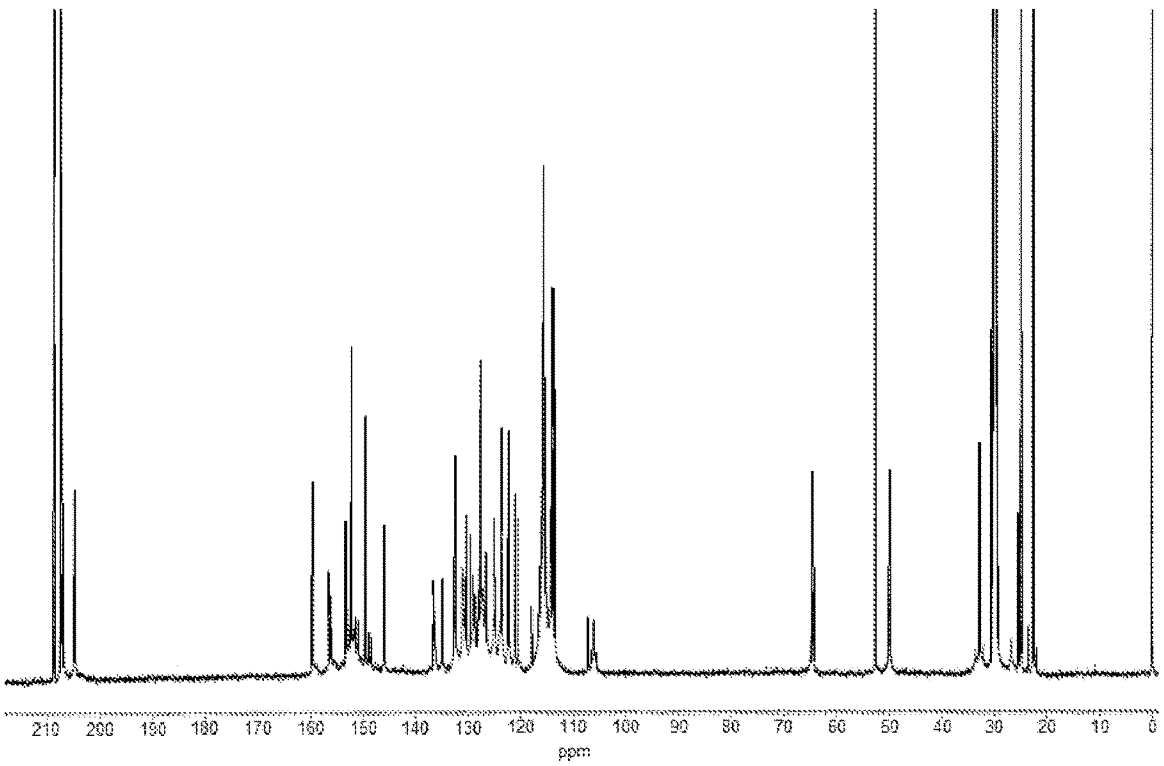
FIG. 3 is a $^{13}$C-NMR chart of the phenolic hydroxy group-containing resin obtained in Synthesis Example 1.

Into a flask equipped with a thermometer, a dropping funnel, a cooling tube, a fractionating column, and a stirrer, 320 parts by mass (2.0 mol) of 2,7-dihydroxynaphthalene, 244 parts by mass (3.0 mol) of a 37% by mass aqueous formaldehyde solution, 512 parts of isopropyl alcohol, 351 parts by mass (3.0 mol) of a 48% by mass aqueous potassium hydroxide solution were charged, which were stirred at room temperature while nitrogen was blown in. Then, the temperature was increased up to 75° C., in which the mixture was stirred for 2 hours. After the reaction ended, 360 parts by mass of sodium dihydrogenphosphate was added to neutralize the reaction product, isopropyl alcohol was removed under reduced pressure, and 768 parts by mass of methyl isobutyl ketone (hereinafter abbreviated as "MIBK") was added thereto. The obtained organic layer was washed with water repeatedly three times with 480 parts by mass of water, and MIBK was removed under heat and reduced pressure to obtain 339 parts by mass of a phenolic hydroxy group-containing resin (A1). The obtained phenolic hydroxy group-containing resin (A1) was solid and had a number average molecular weight (Mn) of 584, a weight average molecular weight (Mw) of 727, and a polydispersity (Mw/Mn) of 1.25 measured by GPC. FIG. 1, FIG. 2, and FIG. 3 illustrate a GPC chart, an FD-MS chart, and a $^{13}$C-NMR chart of the phenolic hydroxy group-containing resin (A1), respectively. From the peaks of 332, 344, 374, 498, 516, 528, and 700 in the FD-MS spectrum and $^{13}$C-NMR, the formation of the following compounds was confirmed.

[Chemical Formula 12]

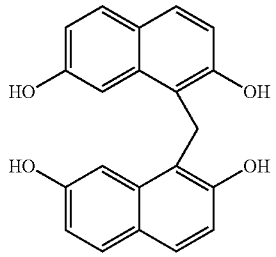

-continued

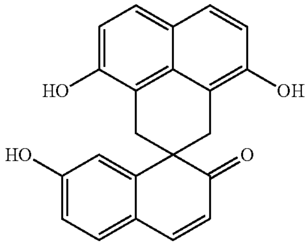

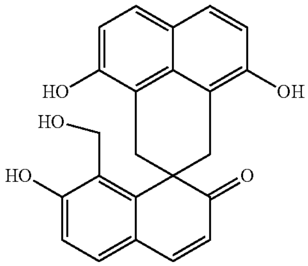

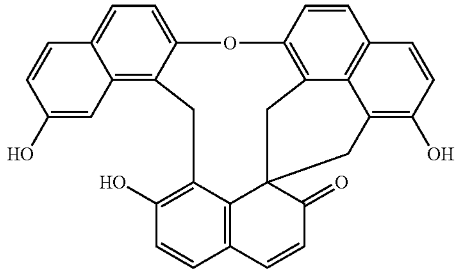

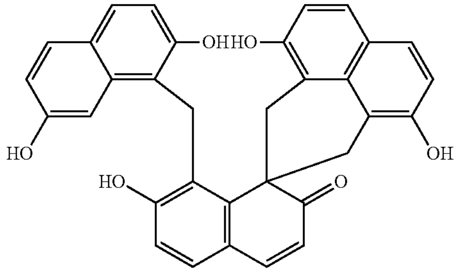

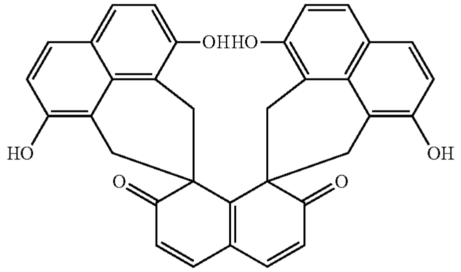

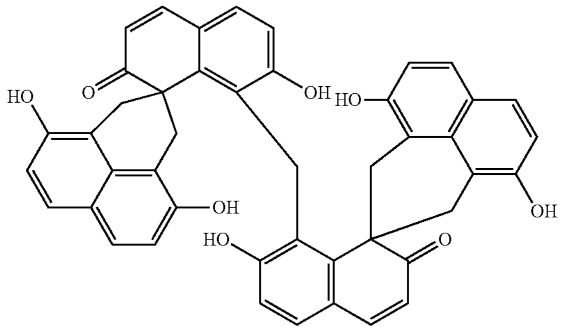

The contents of the respective components contained in the phenolic hydroxy group-containing resin (A1) calculated from the area ratio in the GPC chart were 12% for the component corresponding to the phenolic hydroxy group-containing compound (1), 5% for the component corresponding to the phenolic hydroxy group-containing compound (2), 12% for the component corresponding to the phenolic hydroxy group-containing compound (3), 28% for the component corresponding to the phenolic hydroxy group-containing compound (4), and 29% for the component corresponding to the phenolic hydroxy group-containing compound (5).

Synthesis Example 2: Synthesis of Phenolic Hydroxy Group-Containing Resin (A2)

Figure 4:
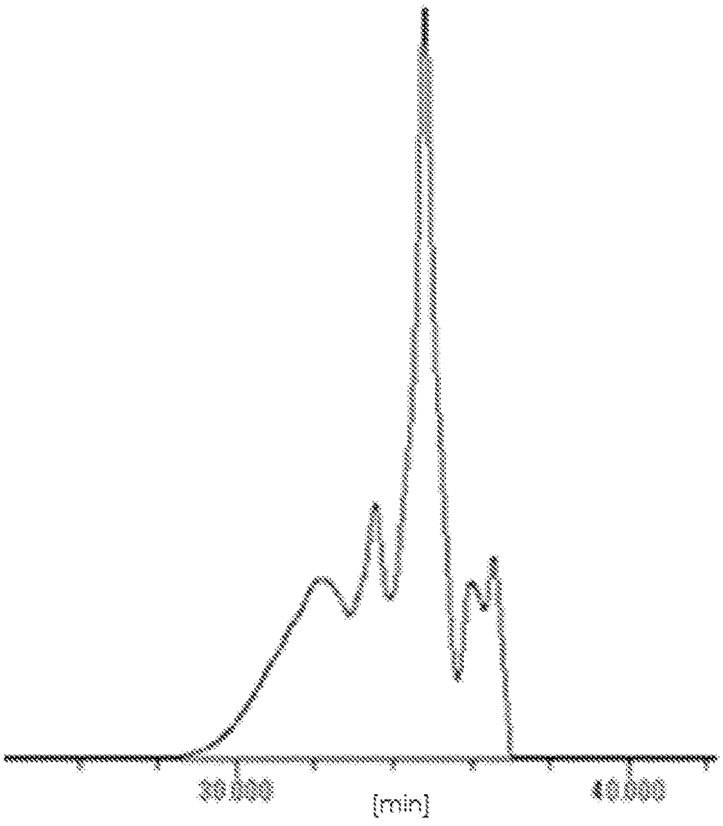
FIG. 4 is a GPC chart of a phenolic hydroxy group-containing resin obtained in Synthesis Example 2.

A phenolic hydroxy group-containing resin (A2) was obtained in the same manner as in Synthesis Example 1 except that the 37% by mass aqueous formaldehyde solution in Synthesis Example 1 was changed to 203 parts by mass (2.5 mol), the 48% by mass aqueous potassium hydroxide solution was changed to 292 parts by mass (2.50 mol), and sodium dihydrogenphosphate was changed to 300 parts by mass. The obtained phenolic hydroxy group-containing resin (A2) was solid and had a number average molecular weight (Mn) of 550, a weight average molecular weight (Mw) of 687, and a polydispersity (Mw/Mn) of 1.25 measured by GPC. FIG. 4 illustrates the GPC chart of the phenolic hydroxy group-containing resin (A2).

The contents of the respective components contained in the phenolic hydroxy group-containing resin (A2) calculated from the area ratio in the GPC chart were 10% for the component corresponding to the phenolic hydroxy group-containing compound (1), 5% for the component corresponding to the phenolic hydroxy group-containing compound (2), 10% for the component corresponding to the phenolic hydroxy group-containing compound (3), 27% for the component corresponding to the phenolic hydroxy group-containing compound (4), and 34% for the component corresponding to the phenolic hydroxy group-containing compound (5).

Synthesis Example 3: Synthesis of Phenolic Hydroxy Group-Containing Resin (A3)

Figure 5:
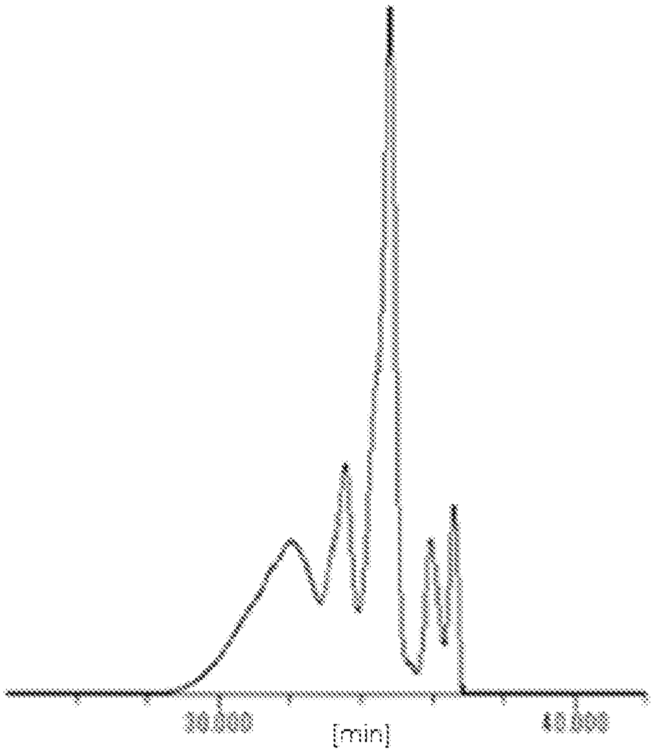
FIG. 5 is a GPC chart of a phenolic hydroxy group-containing resin obtained in Synthesis Example 3.

A phenolic hydroxy group-containing resin (A3) was obtained in the same manner as in Synthesis Example 1 except that the 37% by mass aqueous formaldehyde solution in Synthesis Example 1 was changed to 325 parts by mass (4.0 mol), the 48% by mass aqueous potassium hydroxide solution was changed to 585 parts by mass (5.0 mol), and sodium dihydrogenphosphate was changed to 600 parts by mass. The obtained phenolic hydroxy group-containing resin (A3) was solid and had a number average molecular weight (Mn) of 613, a weight average molecular weight (Mw) of 773, and a polydispersity (Mw/Mn) of 1.26 measured by GPC. FIG. 5 illustrates the GPC chart of the phenolic hydroxy group-containing resin (A3).

The contents of the respective components contained in the phenolic hydroxy group-containing resin (A3) calculated from the area ratio in the GPC chart were 11% for the component corresponding to the phenolic hydroxy group-containing compound (1), 5% for the component corresponding to the phenolic hydroxy group-containing compound (2), 11% for the component corresponding to the phenolic hydroxy group-containing compound (3), 31% for the component corresponding to the phenolic hydroxy group-containing compound (4), and 29% for the component corresponding to the phenolic hydroxy group-containing compound (5).

Comparative Synthesis Example 1: Synthesis of Phenolic Hydroxy Group-Containing Resin (B1)

Figure 6:
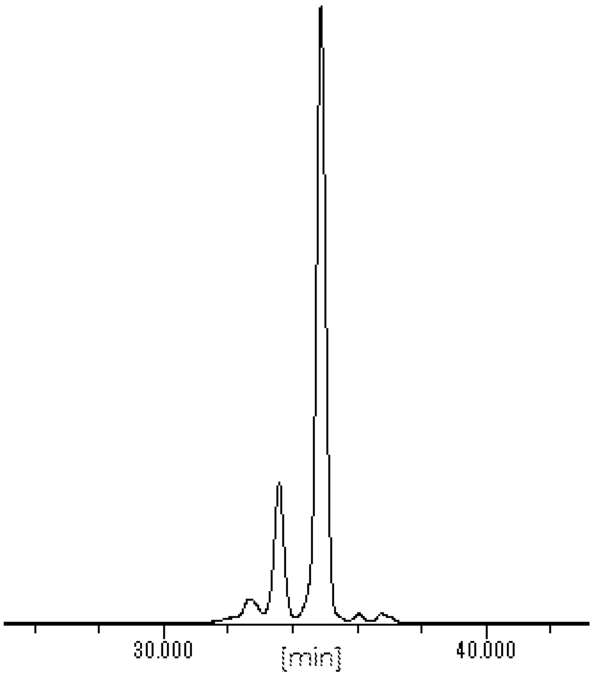
FIG. 6 is a GPC chart of a phenolic hydroxy group-containing resin obtained in Comparative Synthesis Example 1.

A phenolic resin (B1) was obtained in the same manner as in Synthesis Example 1 except that the 37% by mass aqueous formaldehyde solution in Synthesis Example 1 was changed to 162 parts by mass (2.0 mol), the 48% by mass aqueous potassium hydroxide solution was changed to 117 parts by mass (1.0 mol), and sodium dihydrogenphosphate was changed to 120 parts by mass. The obtained phenolic resin (B1) was solid, and GPC indicated a number average molecular weight (Mn) of 528, a weight average molecular weight (Mw) of 552, and a polydispersity (Mw/Mn) of 1.04, with a dimer having a single bond of 72% and a cardo structure-containing oligomer of 25% determined from the area ratio in GPC. FIG. 6 illustrates the GPC chart of the phenolic hydroxy group-containing resin (B1).

The contents of the respective components contained in the phenolic hydroxy group-containing resin (B1) calculated from the area ratio in the GPC chart were no observation for the component corresponding to the compound (1), 18% for the component corresponding to the compound (2), 2% for the component corresponding to the compound (3), 5% for the high molecular weight component, and 72% for the component corresponding to the compound (4).

<Evaluation>[Evaluation of Storage Stability (Solvent Solubility)]

The phenolic hydroxy group-containing resin obtained in each of the synthesis examples and the comparative synthesis example was put in a 10 ml vial and was dissolved in propylene glycol monomethyl ether acetate (PGMEA) and propylene glycol monomethyl ether (PGME) while being heated in a water bath at 80° C., and the resin solution adjusted to have a nonvolatile content of 20% by mass was allowed to cool to room temperature. The obtained resin solution was left at rest at room temperature for 7 days and was then visually evaluated for the presence or absence of insoluble matter. The evaluation criteria are as follows: A: No insoluble matter was observed, B: Insoluble matter was observed in either PGMEA or PGME, C: Some solvents did not allow complete dissolution during dissolution. Or insoluble matter was observed in both solvents.

[Optical Properties]

The phenolic hydroxy group-containing resin obtained in each of the synthesis examples and the comparative example was dissolved in propylene glycol monomethyl ether acetate (PGMEA) to make a resin solution with a nonvolatile content of 5% by mass. The obtained resin solution was applied onto a silicon wafer, which was spin-coated at 1,500 rpm for 30 seconds using a spin coater. This was heated to be dried on a hot plate at 100° C. for 60 seconds to obtain a coating film with a film thickness of 0.1 μm. An n value (a refractive index) and a k value (an attenuation coefficient) of each of these films at wavelengths of 193 and 248 nm were measured using a spectroscopic ellipsometer (manufactured by J. A. Woollam: VUV-VASE GEN-1).

[Preparation of Resist Underlayer Film Compositions for Evaluation of Etching Resistance and Fillability]

To 100 parts by mass of propylene glycol monomethyl ether acetate (PGMEA), added were 1.6 parts by mass of the phenolic hydroxy group-containing resin obtained in each of the synthesis examples and the comparative synthesis example, 0.4 part by mass of a curing agent ("1,3,4,6-tetrakis(methoxymethyl)glycoluril" manufactured by Tokyo Chemical Industry Co., Ltd.), and 0.1 part by mass of p-toluenesulfonic acid, which were mixed together, dissolved, and filtered through a 0.2 μm membrane filter to obtain a resist underlayer film composition for each of examples and a comparative example.

[Etching Resistance]

The obtained resist underlayer film composition was applied onto a 5-inch-diameter silicon wafer using a spin coater and was then heated in a hot plate with an oxygen concentration of 20% by volume at 180° C. for 60 seconds. Furthermore, it was heated at 350° C. for 120 seconds to obtain a silicon wafer with a coating film (resist underlayer film) with a film thickness of 0.3 μm. The formed resist underlayer film was subjected to etching treatment with $CF_4/Ar/O_2$ (CF4: 40 mL/minute, Ar: 20 mL/minute, $O_2$: 5 mL/minute, Pressure: 20 Pa, RF power: 200 W, Processing time: 40 seconds, Temperature: 15° C.) using an etching apparatus ("EXAM" manufactured by Shinko Seiki Co., Ltd.). The film thickness before and after the etching treatment was measured to calculate an etching rate and to evaluate the etching resistance. The evaluation criteria are as follows: A: A case with an etching rate of 150 nm/minute or less, B: A case with an etching rate of greater than 150 nm/minute.

[Fillability (Permeability into Microscopic Spaces)]

A silicon wafer with a coating film (resist underlayer film) for each of the examples and the comparative example was obtained in the same manner as described above except that a 5-inch-diameter silicon wafer formed with a hole pattern of 110 nm in diameter and 300 nm in depth was used. The silicon wafer was split on a hole pattern line, and its section was observed with a scanning electron microscope (manufactured by Hitachi High-Technologies Corporation: SU-3500) to evaluate the fillability. The evaluation criteria are as follows: A: A case of being filled with a resin cured product to the hole bottom, B: A case of not being filled with a resin cured product to the hole bottom or there being partially voids.

[Alkali Solubility]

Thirty-two parts by mass of the phenolic hydroxy group-containing resin obtained in each of the synthesis examples and the comparative synthesis example was dissolved in 60 parts by mass of propylene glycol monomethyl ether acetate to make a solution. The solution was applied onto a 5-inch silicon wafer to give a thickness of about 1 μm using a spin coater. The coated wafer was dried on a hot plate at 110° C. for 60 seconds, and was further subjected to heat treatment at 140° C. for 60 seconds. The obtained wafer with a coating film was immersed in an alkaline developing solution (a 2.38% aqueous tetramethylammonium hydroxide solution) for 60 seconds and was then dried on a hot plate at 110° C. for 60 seconds. The film thickness of each sample before and after immersion in the developing solution was measured, and a value obtained by dividing the difference by 60 to define the alkali solubility [ADR (Å/s)].

Table 1 lists the evaluation results.

TABLE 1

| | Example 1 | Example 2 | Example 3 | Comparative Example 1 |
|---|---|---|---|---|
| Phenolic hydroxy group-containing resin | A1 | A2 | A3 | B1 |

TABLE 1-continued

| | Example 1 | Example 2 | Example 3 | Comparative Example 1 |
|---|---|---|---|---|
| Storage stability | A | A | A | C |
| n value (193 nm) | 1.01 | 1.01 | 1.01 | — |
| k value (193 nm) | 0.99 | 0.99 | 0.99 | — |
| n value (248 nm) | 2.05 | 2.05 | 2.05 | — |
| k value (248 nm) | 0.72 | 0.72 | 0.72 | — |
| Etching resistance | A | A | A | — |
| Fillability | A | A | A | — |
| Alkali solubility (Å/s) | 15000 | 13500 | 13000 | — |

As is clear from the results in Table 1, the phenolic hydroxy group-containing resins (A1) to (A3) according to the examples of the present invention have excellent solvent solubility and fillability, and the coating films formed by curing the phenolic hydroxy group-containing resins (A1) to (A3) have excellent optical properties and etching resistance, and thus it is found that the resins have low viscosity and low polarity and can be used for ultrafine wiring pattern formation. On the other hand, the phenolic hydroxy group-containing resin (B1) according to the comparative example of the present invention has poor solubility in general-purpose resins in resist uses in the first place, and thus it is found that the problem of the present invention has not been solved.

The invention claimed is:

1. A phenolic hydroxy group-containing resin comprising one or more phenolic hydroxy group-containing compounds (1) selected from the group consisting of a compound (1) represented by Structural Formula (1) below and a compound (1') represented by Structural Formula (1') below:

[Chemical Formula 1]

(1)

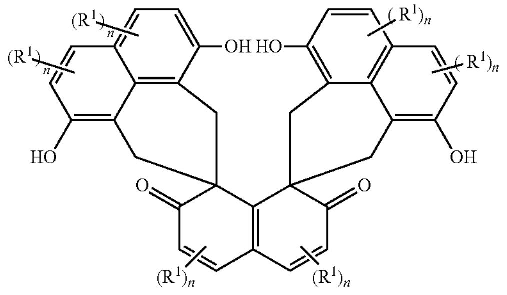

in the formula, $R^1$'s are each independently a hydrogen atom, an aliphatic hydrocarbon group, an alkoxy group, or a halogen atom; and n's are each independently an integer of 0 to 2;

[Chemical Formula 2]

(1')

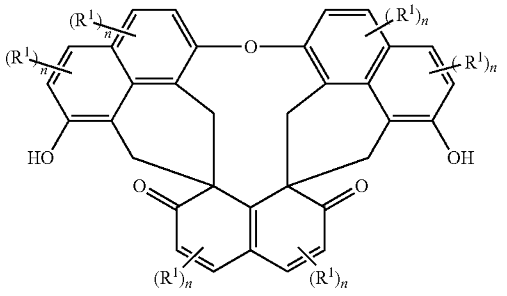

in the formula, $R^1$'s are each independently a hydrogen atom, an aliphatic hydrocarbon group, an alkoxy group, or a halogen atom; and n's are each independently an integer of 0 to 2.

2. The phenolic hydroxy group-containing resin according to claim 1, comprising one or more phenolic hydroxy group-containing compounds (2) selected from the group consisting of a compound (2) represented by Structural Formula (2) below and a compound (2') represented by Structural Formula (2') below:

[Chemical Formula 3]

(2)

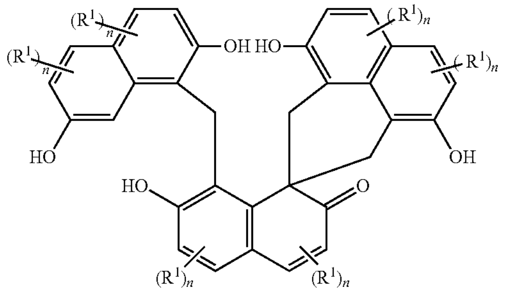

in the formula, $R^1$'s are each independently a hydrogen atom, an aliphatic hydrocarbon group, an alkoxy group, or a halogen atom; and n's are each independently an integer of 0 to 2;

[Chemical Formula 4]

(2')

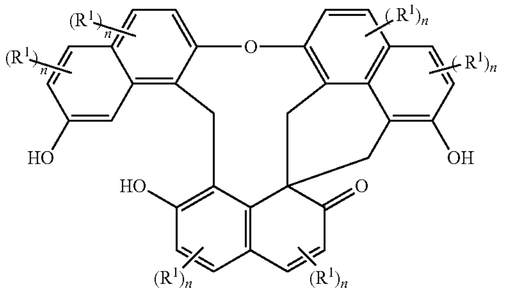

in the formula, $R^1$'s are each independently a hydrogen atom, an aliphatic hydrocarbon group, an alkoxy group, or a halogen atom; and n's are each independently an integer of 0 to 2.

3. The phenolic hydroxy group-containing resin according to claim 2, wherein a total content of the phenolic hydroxy group-containing compound (1) and the phenolic hydroxy group-containing compound (2) in the phenolic hydroxy group-containing resin that is a value calculated from an area ratio in a GPC chart is in a range of 9% or more to 45% or less.

4. The phenolic hydroxy group-containing resin according to claim 1, wherein the phenolic hydroxy group-containing resin is obtained by reacting together 2,7-dihydroxynaphthalenes and formaldehyde in presence of the formaldehyde in a range of 1.1 times or more to 10 times or less with respect to the 2,7-dihydroxynaphthalenes on a molar basis and an alkaline catalyst in a range of 1.1 times or more to 10 times or less with respect to the 2,7-dihydroxynaphthalenes on a molar basis.

5. A resin composition for an alkaline developable resist, the resin composition comprising:

the phenolic hydroxy group-containing resin according to claim 1;

a photosensitizer; and an organic solvent.

6. A coating film obtained by curing the resin composition for an alkaline developable resist according to claim 5.

7. A resist curable resin composition comprising:

the phenolic hydroxy group-containing resin according to claim 1;

a curing agent; and an organic solvent.

8. A coating film obtained by curing the resist curable resin composition according to claim 7.

9. A method for producing a phenolic hydroxy group-containing resin according to claim 1, the method comprising a step of reacting together 2,7-dihydroxynaphthalenes and formaldehyde in presence of the formaldehyde in a range of 1.1 times or more to 10 times or less with respect to the 2,7-dihydroxynaphthalenes on a molar basis and an alkaline catalyst in a range of 1.1 times or more to 10 times or less with respect to the 2,7-dihydroxynaphthalenes on a molar basis.

10. The phenolic hydroxy group-containing resin according to claim 2, wherein the phenolic hydroxy group-containing resin is obtained by reacting together 2,7-dihydroxynaphthalenes and formaldehyde in presence of the formaldehyde in a range of 1.1 times or more to 10 times or less with respect to the 2,7-dihydroxynaphthalenes on a molar basis and an alkaline catalyst in a range of 1.1 times or more to 10 times or less with respect to the 2,7-dihydroxynaphthalenes on a molar basis.

11. The phenolic hydroxy group-containing resin according to claim 3, wherein the phenolic hydroxy group-containing resin is obtained by reacting together 2,7-dihydroxynaphthalenes and formaldehyde in presence of the formaldehyde in a range of 1.1 times or more to 10 times or less with respect to the 2,7-dihydroxynaphthalenes on a molar basis and an alkaline catalyst in a range of 1.1 times or more to 10 times or less with respect to the 2,7-dihydroxynaphthalenes on a molar basis.

12. A resin composition for an alkaline developable resist, the resin composition comprising:

the phenolic hydroxy group-containing resin according to claim 2;

a photosensitizer; and an organic solvent.

13. A resin composition for an alkaline developable resist, the resin composition comprising:

the phenolic hydroxy group-containing resin according to claim 3;

a photosensitizer; and an organic solvent.

14. A resin composition for an alkaline developable resist, the resin composition comprising:

the phenolic hydroxy group-containing resin according to claim 4;

a photosensitizer; and an organic solvent.

15. A coating film obtained by curing the resin composition for an alkaline developable resist according to claim 12.

16. A coating film obtained by curing the resin composition for an alkaline developable resist according to claim 13.

17. A resist curable resin composition comprising:

the phenolic hydroxy group-containing resin according to claim 2;

a curing agent; and an organic solvent.

18. A resist curable resin composition comprising:

the phenolic hydroxy group-containing resin according to claim 3;

a curing agent; and an organic solvent.

19. A resist curable resin composition comprising:

the phenolic hydroxy group-containing resin according to claim 4 a curing agent; and an organic solvent.

20. A coating film obtained by curing the resist curable resin composition according to claim 17.

* * * * *